(12) United States Patent
Okuzawa

(10) Patent No.: US 11,323,689 B2
(45) Date of Patent: May 3, 2022

(54) IMAGE PROCESSING DEVICE, IMAGING DEVICE, IMAGE PROCESSING METHOD, AND RECORDING MEDIUM

(71) Applicant: CANON KABUSHIKI KAISHA, Tokyo (JP)

(72) Inventor: Masahiko Okuzawa, Kamakura (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 16/984,343

(22) Filed: Aug. 4, 2020

(65) Prior Publication Data
US 2020/0366882 A1   Nov. 19, 2020

Related U.S. Application Data

(63) Continuation of application No. PCT/JP2019/003403, filed on Jan. 31, 2019.

(30) Foreign Application Priority Data

Feb. 6, 2018 (JP) .............................. JP2018-019449

(51) Int. Cl.
*H04N 13/282* (2018.01)
*H04N 13/156* (2018.01)
*H04N 13/111* (2018.01)

(52) U.S. Cl.
CPC ......... *H04N 13/282* (2018.05); *H04N 13/111* (2018.05); *H04N 13/156* (2018.05)

(58) Field of Classification Search
CPC .. H04N 13/282; H04N 13/156; H04N 13/111; H04N 5/23229; H04N 5/232123;
(Continued)

(56) References Cited

U.S. PATENT DOCUMENTS 8,872,804 B2   10/2014   Martin et al.
9,346,358 B2   5/2016    Kinoshita et al.
(Continued)

FOREIGN PATENT DOCUMENTS

CN   104049898 A     9/2014
EP   1 085 751 B1    11/2012
(Continued)

OTHER PUBLICATIONS

The International Search Report of PCT/JP2019/003403 Apr. 16, 2019, which is enclosed.

(Continued)

*Primary Examiner* — Tung T Vo
(74) *Attorney, Agent, or Firm* — Cowan, Liebowitz & Latman, P.C.

(57) ABSTRACT

An image processing device includes an imaging unit which captures an image of a subject, generates an image from a plurality of viewpoint images with different viewpoints, and displays the generated image on a display unit. A system control unit acquires a position designated using an operation unit by a user on a displayed image and detects a direction of a slide operation and an amount of movement from the designated position. An image processing unit acquires a plurality of pieces of viewpoint image data from the imaging unit and acquires distance information associated with a viewpoint image from a distance information acquisition unit. The image processing unit generates a viewpoint image if the viewpoint is moved in a direction opposite to the direction of the slide operation by the user on the basis of the plurality of viewpoint images.

9 Claims, 14 Drawing Sheets

(58) Field of Classification Search
CPC ......... H01L 27/14603; H01L 27/14643; H01L 27/14627; G06T 5/50; G06T 1/00; G06F 3/0484
USPC ........................................................... 348/43
See application file for complete search history.

(56) References Cited

U.S. PATENT DOCUMENTS

| | | | | |
|---|---|---|---|---|
| 2008/0259169 | A1* | 10/2008 | Nagano | H04N 5/23248 348/208.4 |
| 2013/0063384 | A1* | 3/2013 | Ito | G06F 3/0485 345/173 |
| 2013/0235036 | A1* | 9/2013 | Fukui | H04N 13/122 345/419 |
| 2014/0267243 | A1* | 9/2014 | Venkataraman | H04N 13/106 345/419 |
| 2014/0307522 | A1* | 10/2014 | Kashima | G01S 15/02 367/7 |
| 2015/0198815 | A1* | 7/2015 | Orimoto | G06K 15/021 358/1.18 |
| 2016/0307372 | A1* | 10/2016 | Pitts | H04N 5/22541 |
| 2017/0171592 | A1* | 6/2017 | Cui | G06F 3/04845 |
| 2017/0180635 | A1* | 6/2017 | Hayashi | H04N 7/183 |
| 2018/0063461 | A1* | 3/2018 | Kim | G09G 3/003 |
| 2018/0150989 | A1* | 5/2018 | Mitsui | H04N 5/232935 |
| 2019/0028640 | A1 | 1/2019 | Kanda et al. | |
| 2019/0306491 | A1* | 10/2019 | Koyama | G06F 3/04815 |

FOREIGN PATENT DOCUMENTS

| | | |
|---|---|---|
| JP | 3774597 A | 5/2006 |
| JP | 2014-526096 A | 10/2014 |
| JP | 2015-193280 A | 11/2015 |
| JP | 2017-098929 A | 6/2017 |
| JP | 2017-184217 A | 10/2017 |

OTHER PUBLICATIONS

The above foreign patent document was cited in the Mar. 22, 2022 Japanese Office Action, a copy of which is enclosed without an English Translation, that issued in Japanese Patent Application No. 2018-019449.

* cited by examiner

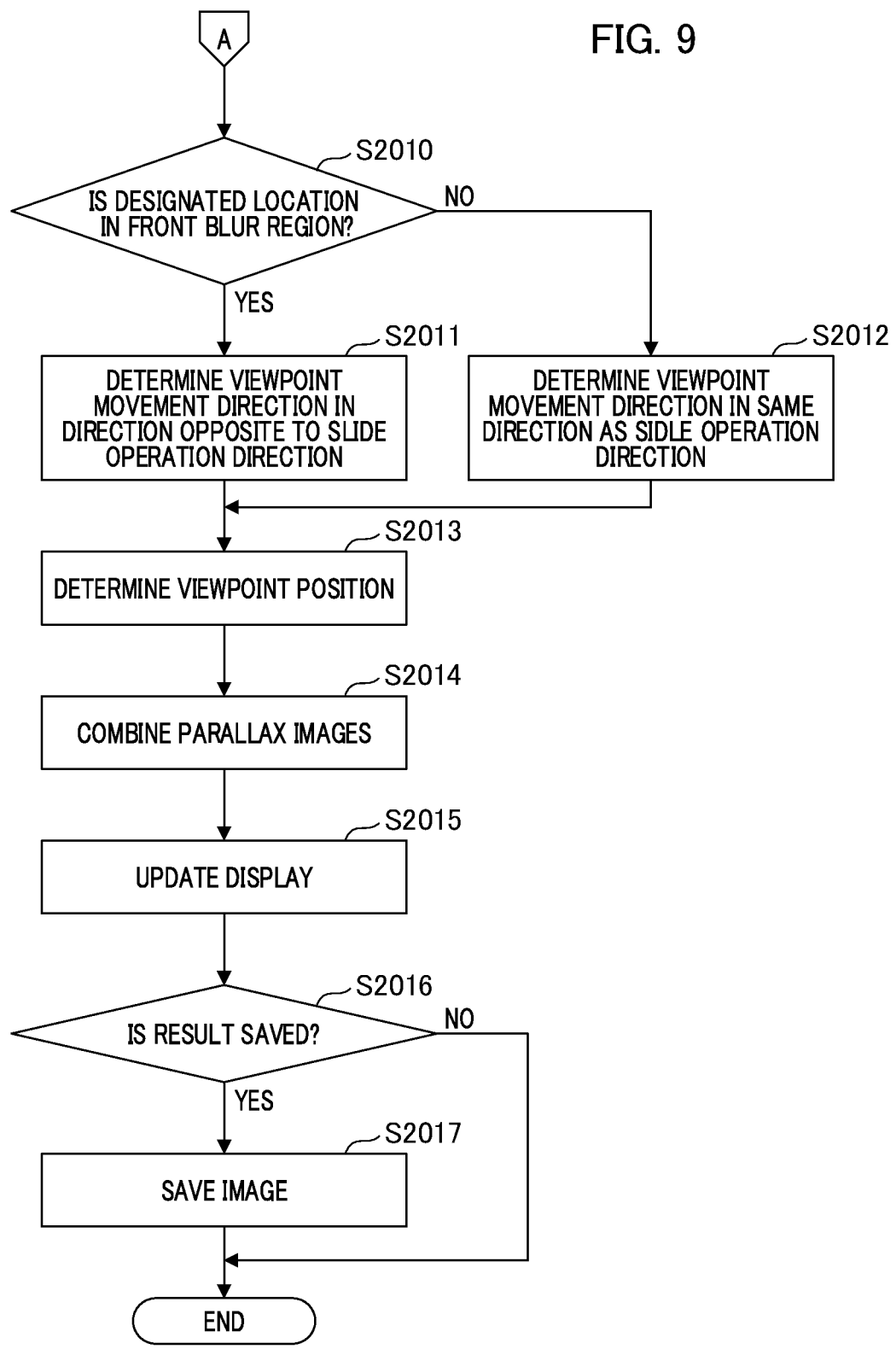

IMAGE PROCESSING DEVICE, IMAGING DEVICE, IMAGE PROCESSING METHOD, AND RECORDING MEDIUM

CROSS-REFERENCE TO RELATED APPLICATIONS

This application is a Continuation of International Patent Application No. PCT/JP2019/003403, filed Feb. 18, 2019, which claims the benefit of Japanese Patent Application No. 2018-019449, filed Feb. 6, 2018, both of which are hereby incorporated by reference herein in their entirety.

BACKGROUND OF THE INVENTION

Field of the Invention

The present invention relates to an image processing technique of generating an image in which a viewpoint is changed from a plurality of images having parallax.

Background Art

There are imaging devices which can obtain data of viewpoint images with different viewpoints through phase difference detection using an imaging element in which a pixel section includes a plurality of microlenses and a photoelectric conversion unit corresponding to each of the microlenses. The imaging device described in Patent Literature 1 detects a focus through two viewpoint images using an imaging element of which one pixel is constituted of one microlens and two subpixels. An image output can be obtained by adding pixel values of the subpixels sharing the one microlens and treating the sum pixel value as one pixel value.

Although parallax images are a plurality of images with different viewpoints, by storing data of these images in a recording medium, it is possible to set a viewpoint position to another position after photographing and regenerate an image. Patent Literature 2 describes a technique of changing a viewpoint position on the basis of a parallax image. If a blur unintentionally covers in front of a target subject when a user performs photographing, it is possible to obtain an appropriate image after photographing by moving a viewpoint to a position in which the blur does not cover the subject using the above technique.

CITATION LIST

Patent Literature

Patent Literature 1: Japanese Patent No. 3774597
Patent Literature 2: Japanese Patent Laid-Open No. 2017-184217

In Patent Literature 2, a method of changing a viewpoint on the basis of a parallax image is realized using a user interface (UI) in which a user designates a moving direction of the viewpoint. However, in this UI, for example, in a front blurring photograph in which a blur region covers the front of the subject, the moving direction of the viewpoint and a direction in which the front blur moves are opposite to each other. Thus, there is a problem that it may be difficult for the user to intuitively understand where the blur region will move. Front blurring is a phenomenon in which a main subject is hidden in the blur region if a second subject (a foreground) located in front of a first subject which is the main subject has a large blur.

SUMMARY OF THE INVENTION

An object of the present invention is to provide an image processing device which can change a viewpoint through an easy-to-understand operation at the time of generating an image from a plurality of images having different viewpoints.

An image processing device according to an embodiment of the present invention is an image processing device which generates image data on the basis of data of a plurality of viewpoint images with different viewpoints, including: an acquisition unit for acquiring data of the plurality of viewpoint images; a designating unit which designates a position on an image displayed by a display unit; a detecting unit which detects a moving direction and an amount of movement of a position designated by the designating unit; and a generating unit which generates a viewpoint image if a viewpoint is moved in accordance with the amount of movement in a direction opposite to the moving direction detected by the detecting unit on the basis of the plurality of viewpoint images.

According to the image processing device of the present invention, it is possible to provide an image processing device which can change a viewpoint by an easy-to-understand operation at the time of generating an image from a plurality of images with different viewpoints.

Further features of the present invention will become apparent from the following description of exemplary embodiments with reference to the attached drawings.

BRIEF DESCRIPTION OF THE DRAWINGS

FIG. 9 is a flowchart for describing a process continuing from that of FIG. 8.

DESCRIPTION OF THE EMBODIMENTS

Preferred embodiments of the present invention will be described in detail with reference to the accompanying drawings. In the following description, in an imaging device to which an image processing device according to the present invention is applied, images with different viewpoints acquired using an imaging unit are referred to as "viewpoint images." It is assumed that a parallax image is constituted of a plurality of viewpoint images.

First Embodiment

Figure 1:
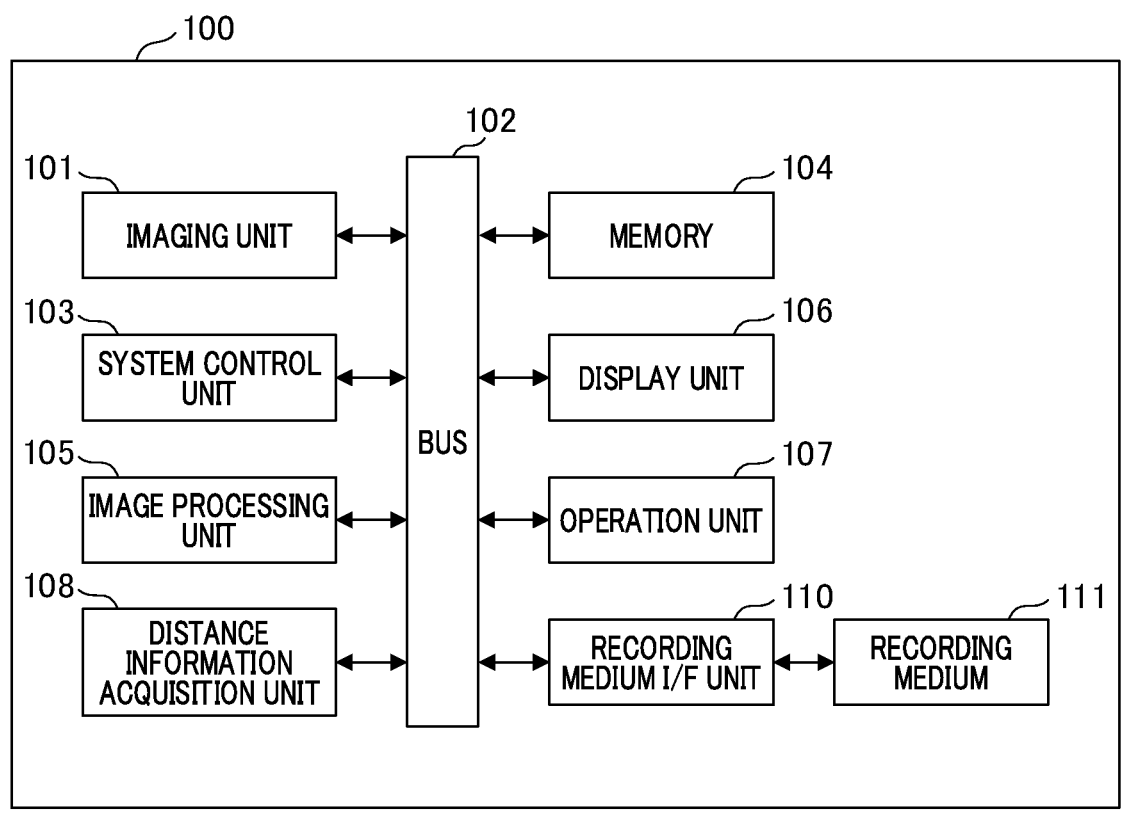
FIG. 1 is a configuration diagram of an image processing device according to an embodiment of the present invention.

FIG. 1 is a configuration diagram of an image processing device 100 according to this embodiment. The image processing device 100 has an imaging function and can record images having parallax, that is, data of a plurality of viewpoint images. Furthermore, the image processing device 100 performs image processing on a plurality of viewpoint images to generate one image and performs screen display and recording processing.

An imaging unit 101 includes, lenses, a shutter, a diaphragm, and an imaging element and picks up an image of a subject through the lenses constituting an imaging optical system. The imaging element includes, for example, a photoelectric conversion unit in which each pixel section is separate in a leftward/rightward direction and can acquire a pair of image signals. Details of a pixel structure will be described later with reference to FIG. 2. A bus 102 connects units in the image processing device 100 and data and a control signal are exchanged through the bus 102.

A system control unit 103 controls the entire image processing device 100. The system control unit 103 includes a central processing unit (CPU) and executes a program stored in a non-volatile memory or the like (not shown) to implement each process of this embodiment. A memory 104 stores viewpoint image data obtained from the imaging unit 101, intermediate data of image processing, and the like. The memory 104 has a storage capacity sufficient to store a predetermined number of pieces of captured image data.

An image processing unit 105 generates data of one combined image from a plurality of viewpoint images stored in the memory 104 and stores the data in the memory 104. Furthermore, the image processing unit 105 performs various image processing such as gamma correction, noise reduction, and color space conversion. The image processing unit 105 performs conversion into a format such as a joint photographic experts group (JPEG) on the image-processed data to generate recording output data and display image data and stores the generated data in the memory 104.

A display unit 106 includes a liquid crystal display panel and the like and displays display image data stored in the memory 104, a graphical user interface (GUI) screen, and the like. An operation unit 107 receives user operations concerning the image processing device 100 and instructions for performing image processing on a captured image. The operation unit 107 includes operation buttons provided in a device main body unit of the image processing device 100, a touch panel which can be operated on a display screen of the display unit 106, and the like and notifies the system control unit 103 of a user's operation instruction.

A distance information acquisition unit 108 acquires amounts of image shifting and amounts of defocus from a pair of pieces of viewpoint image data stored in the memory 104 and acquires distance information of the subject. The distance information is depth information in a depth direction of a captured image and it is possible to perform a determination concerning whether the subject at a designated location is in front of an image formation position using the distance information. To be specific, amounts of image shifting are obtained from a pair of pieces of viewpoint image data and it is possible to perform a determination concerning whether the subject at the designated location is in front of the image formation position using a sign of an amount of defocus calculated using a defocus coefficient from the amounts of image shifting. A position in which the amount of defocus is zero corresponds to the image formation position and a forward/rearward relationship above an optical axis of the imaging optical system is determined using a sign of the amount of defocus.

A recording medium I/F unit 110 is an interface unit in which data is transmitted and received to and from a recording medium 111 such as a memory card. The recording medium 111 is constituted of a semiconductor memory or the like and records captured image data and information associated with the data. Data is recorded on the recording medium 111 via the recording medium I/F unit 110 and data is read from the recording medium 111.

Figure 2:
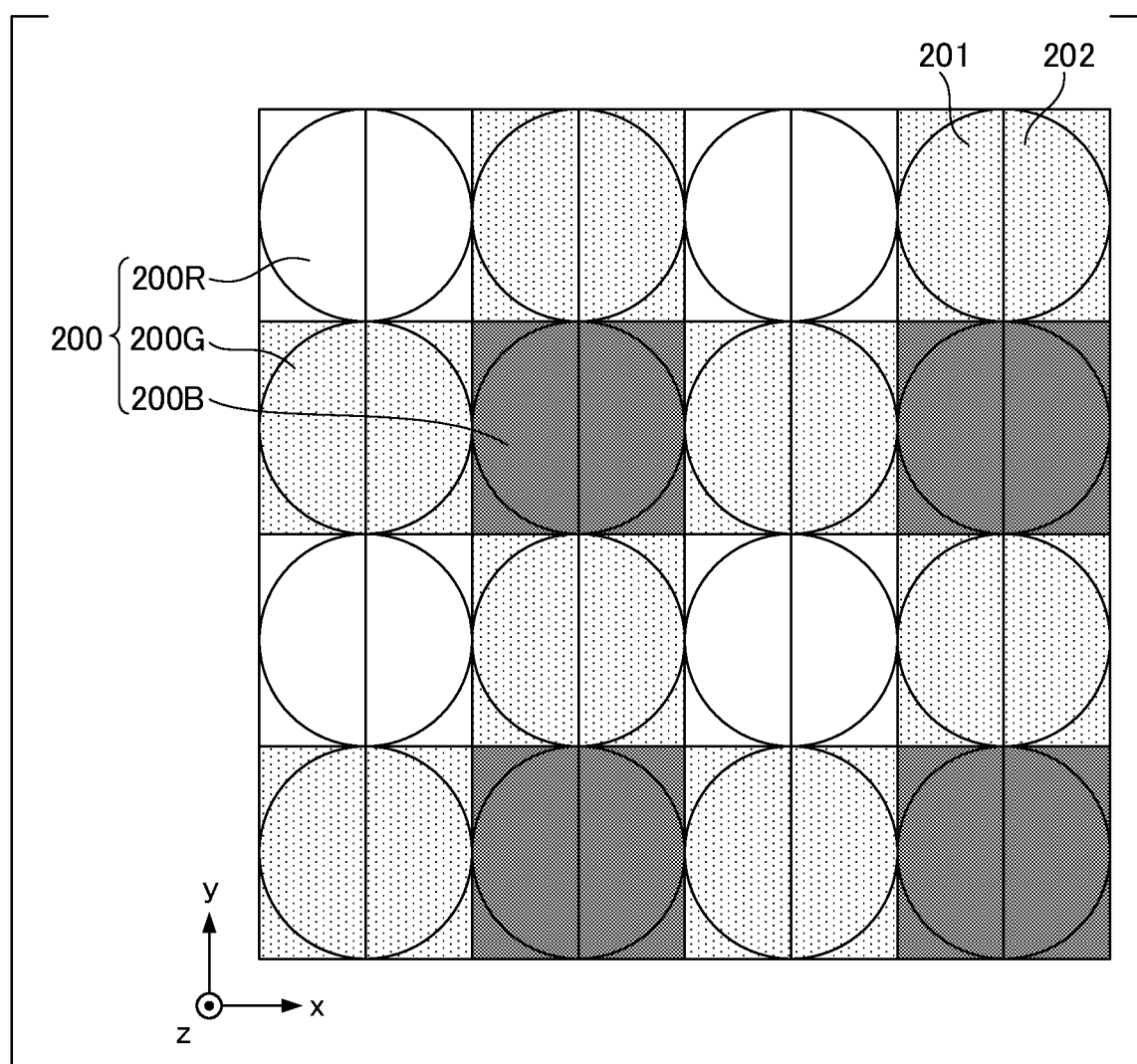
FIG. 2 is a schematic diagram illustrating an example of pixel arrangement of an imaging element.

An imaging function of the image processing device 100 will be described below. The user instructs the image processing device 100 to perform capturing using the operation unit 107. FIG. 2 is a schematic diagram illustrating an example of pixel arrangement in the imaging element in the imaging unit 101 and a region in which four pixels in a horizontal direction and four pixels in a vertical direction are arranged is representatively illustrated. The imaging element can divide a pupil region of the imaging optical system and generate a plurality of image signals based on light fluxes passing through different pupil partial regions. To be specific, a photoelectric conversion unit constituting each pixel section is divided into two parts in a horizontal direction (a pupil division direction).

In the embodiment, a 2×2 pixel group 200 on the upper left side of FIG. 2 corresponds to a repeating unit of a color filter of a primary color Bayer array provided in the imaging element. A pixel 200R with red (R) spectral sensitivity is arranged on the upper left side and pixels 200G with green (R) spectral sensitivity are arranged on the upper right side and the lower left side. A pixel 200B with blue (B) spectral sensitivity is arranged on the lower right side. As representatively illustrated in the pixel section on the upper right side of FIG. 2, the left half of a photoelectric conversion unit divided into two parts in a horizontal direction is assumed to be a photoelectric conversion unit 201 and a right half thereof is assumed to be a photoelectric conversion unit 202. First image data to be obtained from an output of the photoelectric conversion unit 201 and second image data to be obtained from an output of the photoelectric conversion unit 202 constitute parallax image data (a pair of pieces of viewpoint image data). That is to say, it is possible to generate a parallax image by performing capturing once. Furthermore, it is possible to obtain captured image data by adding and reading the outputs of the photoelectric conversion units 201 and 202. Parallax image data and captured image data are stored in the memory 104.

In the imaging element, by arranging a plurality of imaging pixels of four rows and four columns (a photoelectric conversion unit of four rows and eight columns) illustrated in FIG. 2 above an imaging surface, it is possible to obtain a captured image signal and a viewpoint image signal. That is to say, it is possible to perform focus detection of an imaging plane phase difference detection method while obtaining a captured image.

Figure 3A:
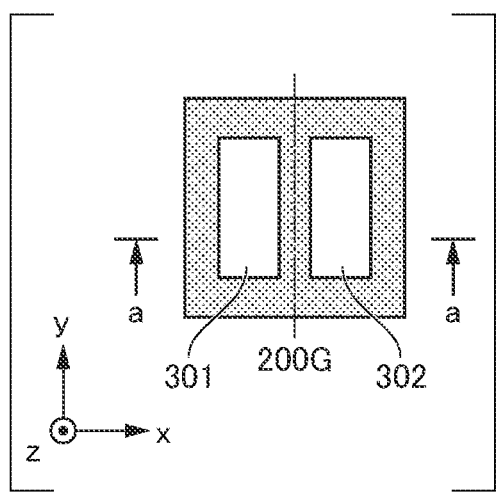
FIGS. 3A and 3B are schematic diagrams illustrating a pixel structure in the imaging element.
Figure 3B:
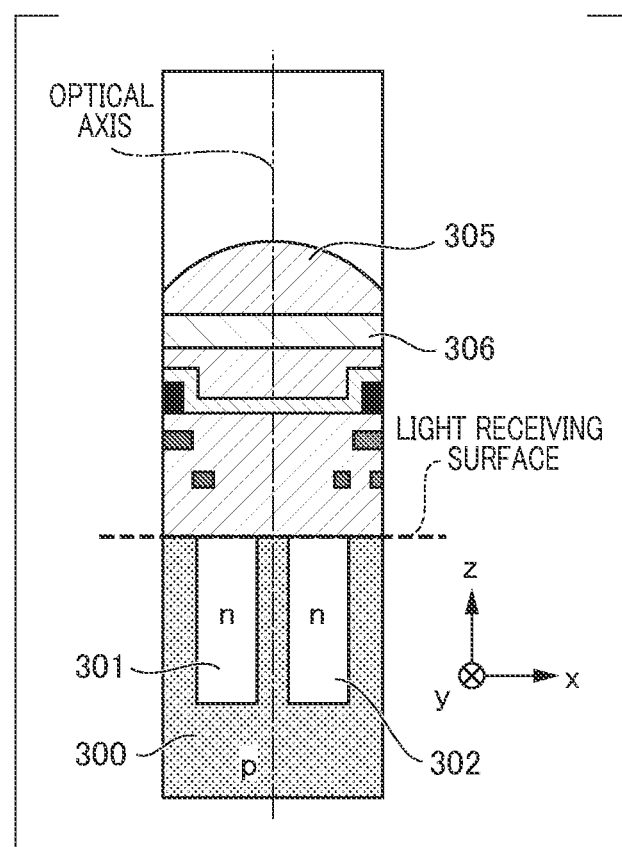

FIG. 3A is a plan view of one pixel 200G in the imaging element when viewed from a light receiving surface side (a+z direction) thereof. In FIG. 3A, a direction perpendicular to the paper surface is defined as a z direction, a leftward/rightward direction is defined as an x direction, and an upward/downward direction is defined as a y direction. A forward direction is defined as the +z direction, a rightward direction is defined as a +x direction, and an upward direction is defined as a +y direction. FIG. 3B is a cross-sectional view of an a-a cross section of FIG. 3A when viewed from a −y direction. In FIG. 3B, a direction perpendicular to the paper surface is the y direction, the leftward/rightward direction is the x direction, and the upward/downward direction is the z direction.

A microlens 305 configured to condense incident light on a light receiving surface side is formed in the pixel 200G. The photoelectric conversion unit 300 is divided into $N_H$ in the x direction and $N_V$ in the y direction. Although $N_H=2$ and $N_V=1$ are satisfied and two photoelectric conversion units 301 and 302 are formed in the example of FIGS. 3A and 3B, the number of divisions can be set arbitrarily. For example, a structure in which first to fourth photoelectric conversion units divided into two parts in the horizontal direction and the vertical direction with $N_H=2$ and $N_V=2$ may correspond to one microlens.

The photoelectric conversion units 301 and 302 have a configuration of a pin structure photodiode in which an intrinsic layer is arranged between a p-type layer and an n-type layer or a pn junction photodiode in which an intrinsic layer is omitted. In each pixel section, a color filter 306 is formed between the microlens 305 and the photoelectric conversion units 301 and 302. The spectral transmittance of the color filter is changed for each photoelectric conversion unit or the color filter is omitted as necessary. The light incident on the pixel 200G is condensed using the microlens 305, is separated through the color filter 306, and then is received by the photoelectric conversion units 301 and 302. In the photoelectric conversion units 301 and 302, a pair of electrons and holes are generated in accordance with an amount of light received and are separated through a depletion layer, and then negatively charged electrons are accumulated in an n-type layer (not shown). On the other hand, the holes are discharged outside of the imaging element through a p-type layer connected to a constant voltage source (not shown). The electrons accumulated in the n-type layers of the photoelectric conversion units 301 and 302 are transferred to an electrostatic capacitance unit (FD) via a transfer gate, converted into a voltage signal, and output as a pixel signal.

Figure 4:
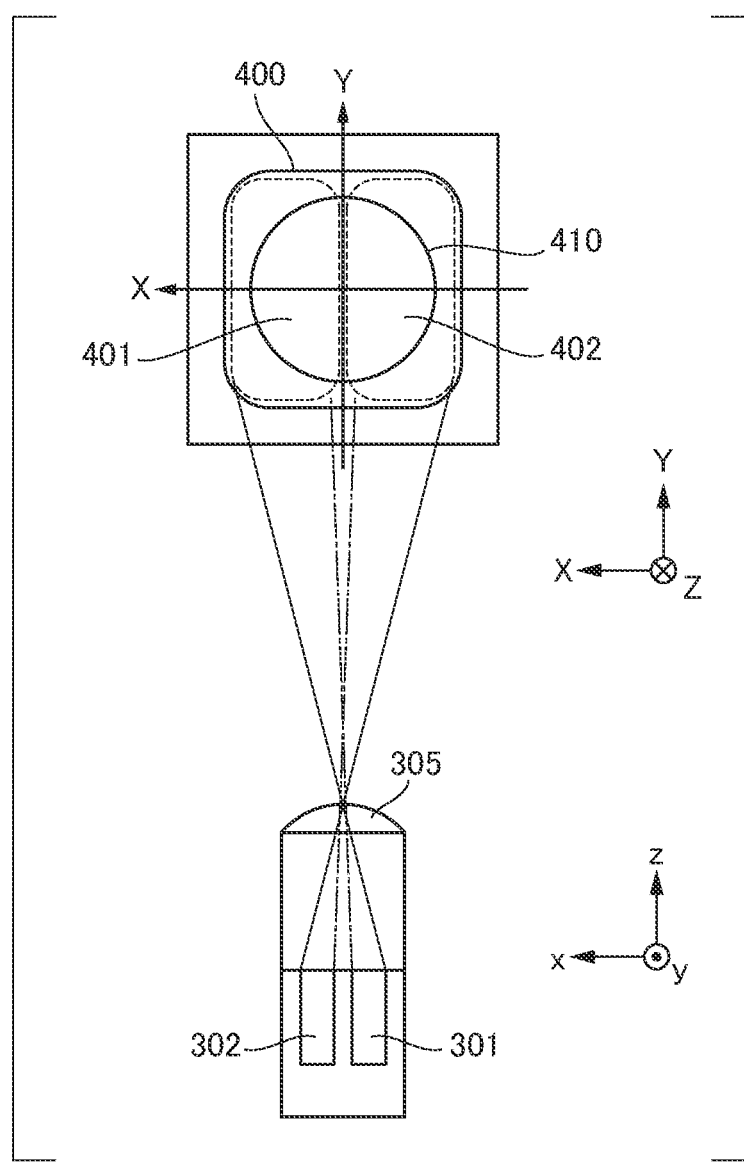
FIG. 4 is a diagram for explaining a correspondence relationship between a pixel structure and pupil division.

FIG. 4 is a diagram for explaining a correspondence relationship between the pixel structure illustrated in FIGS. 3A and 3B and pupil division. The lower side of FIG. 4 illustrates a cross-sectional view of the cross section of the pixel structure taken along the line a-a when viewed from the +y direction and the upper side of FIG. 4 illustrates a diagram of an exit pupil plane (refer to an exit pupil 410) of the imaging optical system when viewed from the −z direction. In FIG. 4, in order to correspond to a coordinate axis of the exit pupil plane, in the cross-sectional view of the pixel structure, an x axis and a y axis are shown as being reversed from the state shown in FIGS. 3A and 3B.

A first pupil partial region 401 is substantially in a conjugate relationship with respect to a light receiving surface of a photoelectric conversion unit 301 whose center of gravity is deviated in the −x direction using the microlens 305. That is to say, the first pupil partial region 401 represents a pupil region in which the photoelectric conversion unit 301 can receive light and a center of gravity is deviated in the +x direction above the exit pupil plane. Furthermore, a second pupil partial region 402 is substantially in a conjugate relationship with respect to a light receiving surface of a photoelectric conversion unit 302 whose center of gravity is deviated in the +x direction using the microlens 305. The second pupil partial region 402 represents a pupil region in which the photoelectric conversion unit 202 can receive light and a center of gravity is deviated in the −x direction above the exit pupil plane.

Figure 5A:
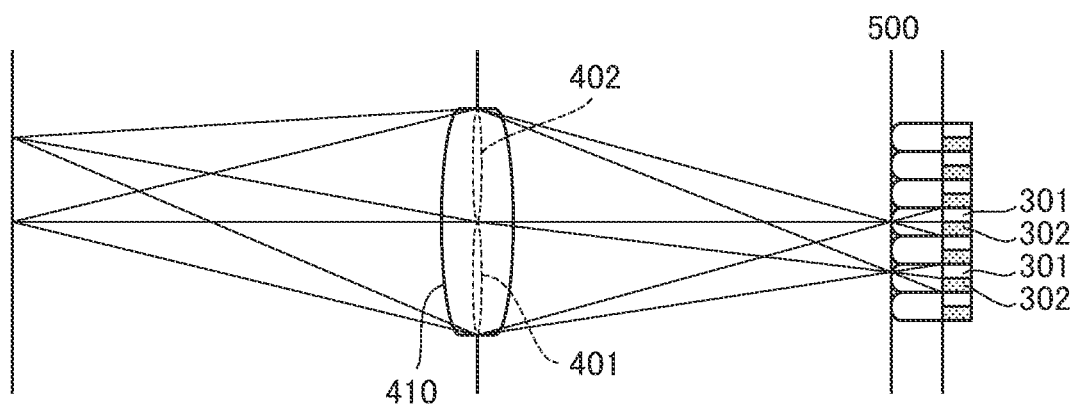
FIGS. 5A and 5B are diagrams illustrating pupil division and a relationship between an amount of defocus and an amount of image shifting.

A region 400 illustrated in FIG. 4 is a pupil region in which the entire pixel 200G when the photoelectric conversion unit 301 and the photoelectric conversion unit 302 are combined can receive light. FIG. 5A is a schematic view of a correspondence relationship between an imaging element and pupil division. The light fluxes passing through the first pupil partial region 401 and the second pupil partial region 402 are incident on pixels of the imaging element at different angles. Light incident on an imaging surface 500 is received by the photoelectric conversion units 301 and 302 which are divided into two parts and each of the photoelectric conversion units converts the light into an electric signal.

Figure 6A:
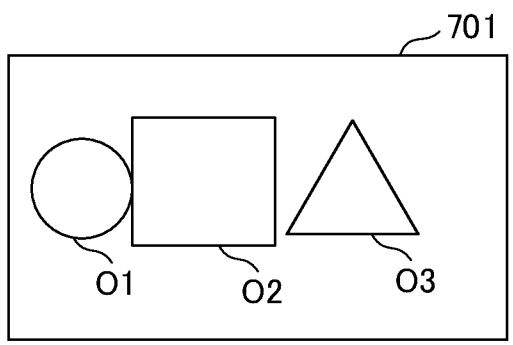
FIGS. 6A to 6D are diagrams illustrating an example of a viewpoint image and a combined image.
Figure 6B:
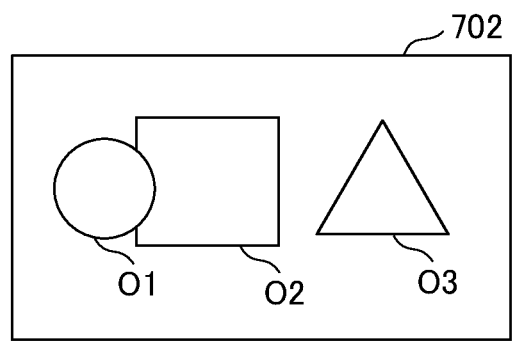

Data of images captured by the imaging unit 101, that is, paired pieces of viewpoint image data is stored in the memory 104. An example of viewpoint image data will be described with reference to FIGS. 6A to 6D. A first viewpoint image 701 illustrated in FIG. 6A is an image acquired through the imaging optical system and represents regions of subjects O1 to O3. The subjects O1 to O3 are present at distances d1 to d3 from the imaging unit 101. A second viewpoint image 702 illustrated in FIG. 6B is an image acquired through the imaging optical system. The viewpoint image 702 has a different viewpoint from the viewpoint image 701 and the region of the subject O1 and the region of the subject O2 overlap. This means that the subject O1 is closer to the imaging unit 101 than the subject O2.

Figure 6C:
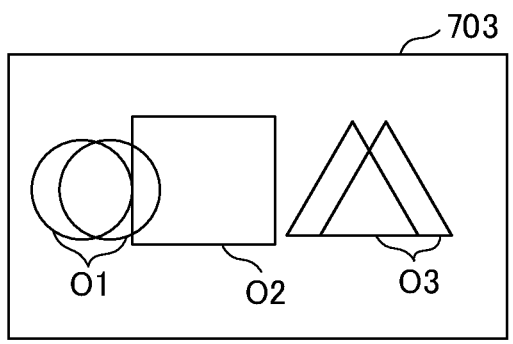

The image processing unit 105 reads viewpoint image data from the memory 104, performs predetermined image processing, and combines parallax images into one image. FIG. 6C illustrates a combined image 703 if the first viewpoint image 701 and the second viewpoint image 702 are combined at a ratio of 1:1. The positions of the subject O2 in the viewpoint images 701 and 702 are the same and the image shift does not occur even in the combined image 703. On the other hand, due to the effect of parallax, the regions of the subjects O1 and O3 in the viewpoint images 701 and 702 have different horizontal positions. For this reason, in the combined image 703, the image shift occurs in the regions of the subjects O1 and O3. In the combined image 703, the subject O2 and the subject O1 overlap. This is because the subject O2 and the subject O1 overlap in the viewpoint image 702 of FIG. 6B.

Figure 6D:
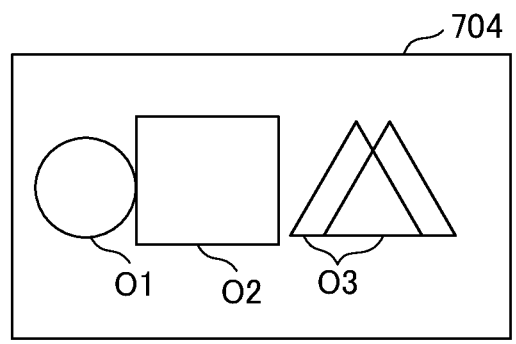

FIG. 6D illustrates a combined image 704 if a combination ratio of the viewpoint image 701 and the viewpoint image 702 for the subject O1 and the subject O2 is changed to 2:0. It is assumed that the viewpoint images 701 and 702 for the subject O3 are combined at a combination ratio of 1:1. In the combined image 704, the regions of the subject O1 and the subject O2 do not overlap. Due to an influence of parallax between the two images to be combined, if the subject O2 present at the distance d2 and the subject O1 present closer to a front side (the imaging unit side) than the subject O2 overlap, it is possible to reduce the overlap of a subject region in the combined image by changing a combination ratio. That is to say, in the combined image, a blurring correction process in which front blurring occurring when an image of a subject region located at a predetermined reference distance and around that distance is combined with an image of a subject region located in front of the image is reduced or removed is possible.

The image processing unit 105 performs predetermined image processing on the combined image, stores the image data in the memory 104, and stores the image data in the recording medium 111 via the recording medium I/F unit 110. At this times, it is also possible to record the parallax image data which is not combined as RAW data in the recording medium 111. The series of processes is controlled using the system control unit 103.

Figure 7:
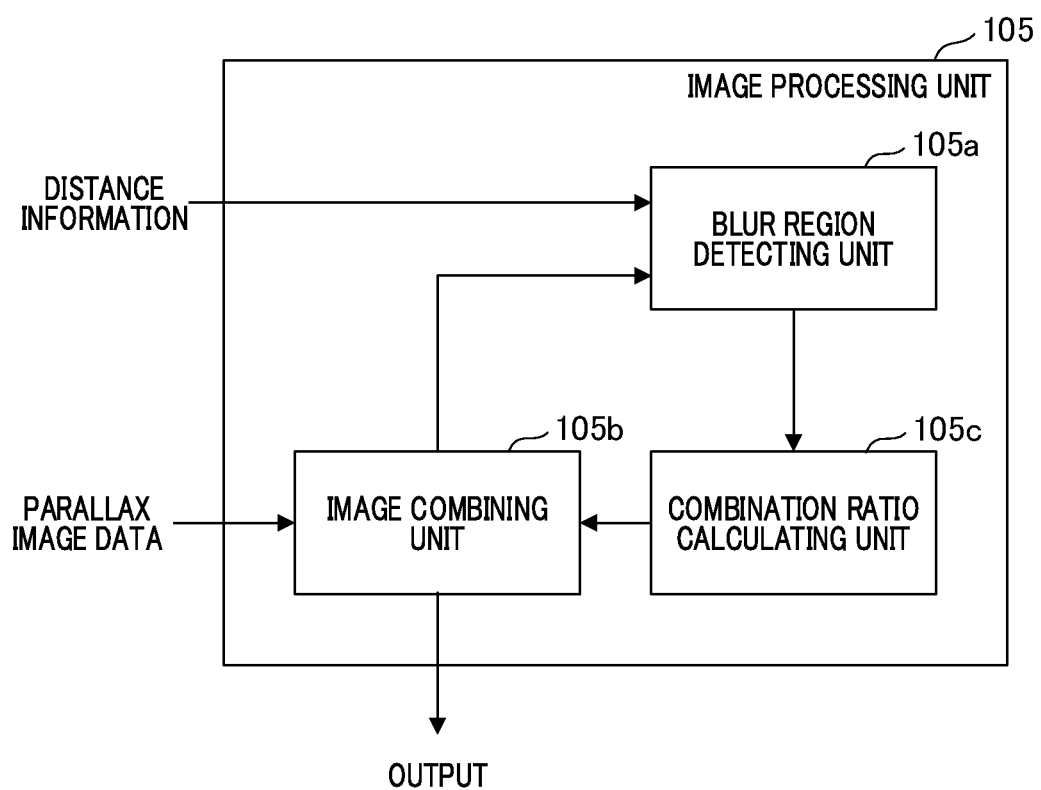
FIG. 7 is a block diagram illustrating an example of a configuration of an image processing unit.

FIG. 7 schematically illustrates, as an example of a configuration of the image processing unit 105, functional elements associated with a process of generating a combined image from a parallax image. The image processing unit 105 includes a blur region detecting unit 105a, an image combining unit 105b, and the combination ratio calculating unit 105c.

The blur region detecting unit 105a detects a blur region in a region surrounding a focus region among a plurality of viewpoint images on the basis of distance information from the distance information acquisition unit 108 and the plurality of viewpoint images. That is to say, a region in which a blur has occurred in the second subject in front of the focused first subject is detected. The combination ratio calculating unit 105c determines a combination ratio for each pixel position of a plurality of viewpoint images on the basis of the detection result of the blur region detecting unit 105a. The image combining unit 105b acquires a plurality of pieces of viewpoint image data, combines a plurality of viewpoint images using a combination ratio calculated by the combination ratio calculating unit 105c, and generates combination image data. A combination of images is performed through weighted addition.

In this embodiment, the first viewpoint image is generated by collecting light receiving signals of a first photoelectric conversion unit 301 of each pixel section of the imaging element and the second viewpoint image is generated by collecting light receiving signals of a second photoelectric conversion unit 302. The image processing unit 105 generates an imaging signal of a predetermined resolution by performing addition and reading of the first photoelectric conversion unit 301 and the second photoelectric conversion unit 302 for each pixel section of the imaging element and outputs the captured image data. A relationship between an amount of image shifting and an amount of defocus of the first viewpoint image and the second viewpoint image will be described with reference to FIG. 5B.

Figure 5B:
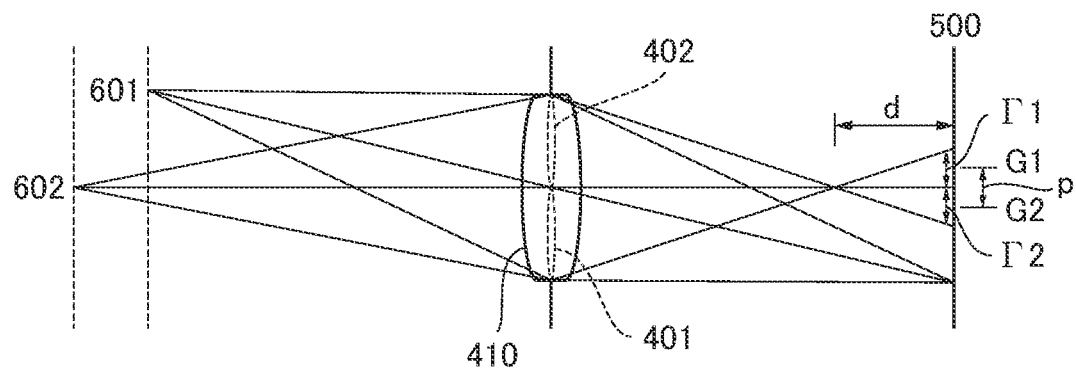

In FIG. 5B, the imaging element (not shown) is arranged above the imaging surface 500. The exit pupil 410 of the imaging optical system is divided into the first pupil partial region 401 and the second pupil partial region 402. An amount of defocus d represents a distance in which a size thereof is from an image formation position of a subject image to the imaging surface 500. Directions are defined such that a front focus state in which the image formation position of the subject image is closer to the subject side than the imaging surface 500 has a negative sign (d<0) and a rear focus state in which the image formation position of the subject image is closer to the imaging surface 500 than the subject side has a positive sign (d>0). A focus state in which the image formation position of the subject image is on an imaging surface (an in-focus position) satisfies d=0. A position of a subject 601 illustrated in FIG. 5B exemplifies a position corresponding to a focus state (d=0) and a position of a subject 602 exemplifies a position corresponding to a front focus state (d<0). Hereinafter, a front focus state (d<0) and a rear focus state (d>0) are collectively referred to as a defocus state (|d|>0).

In a front focus state (d<0), the light flux which has passed through the first pupil partial region 401 (or the second pupil partial region 402) among light fluxes from the subject 602 is temporarily condensed and then spreads to have a width Γ1 (or Γ2) using a position of a center of gravity G1 (or G2) of the light flux as a center. In this case, the image is blurred above the imaging surface 500. The light of the blurred image is received by the photoelectric conversion unit 301 (or the photoelectric conversion unit 302) constituting each pixel arranged in the imaging element and the first viewpoint image (or the second viewpoint image) is generated. Thus, the first viewpoint image (or the second viewpoint image) is detected as a subject image (a blurred image) having a width Γ1 (or Γ2) at a position of a center of gravity G1 (or G2) above the imaging surface 500. The width Γ1 (or Γ2) of the subject image increases substantially proportionally when the size |d| of the amount of defocus d is increased. Similarly, if an amount of image shifting of a subject image between the first viewpoint image and the second viewpoint image is written as "p," the size |p| thereof is increased when the size |d| of the amount of defocus d is increased. For example, an amount of image shifting p is defined as a difference "G1−G2" between positions of centers of gravity of the light fluxes and the size thereof is increased substantially proportionally when |d| is increased. Although an image shift direction of a subject image between the first viewpoint image and the second viewpoint image in the rear focus state (d>0) is opposite to that in the front focus state, there is a similar trend. In this embodiment, when a size of an amount of defocus of an imaging signal obtained by adding the first viewpoint image and the second viewpoint image or the first viewpoint image and the second viewpoint image is increased, a size of an amount of image shifting between the first viewpoint image and the second viewpoint image is increased.

In focus adjustment control of the imaging optical system, a focus lens is driven in accordance with the size of the amount of defocus and the sign and the focus lens is moved to an in-focus position in which a predetermined subject is brought into focus. The image processing unit 105 generates a defocus map representing a distribution of an amount of defocus.

An image editing function of the image processing device 100 will be described below. The user can instruct the image processing device 100 to shift a mode to an image edit mode using the operation unit 107. If the user selects a blur shift function on a menu display screen in the image edit mode, the image processing device 100 reads image data recorded in the recording medium 111. The blur shift function is a function of changing a position of a blur region using the blurring correction process. Through this function, it is possible to change a relative position of a blur region with respect to a predetermined subject region in an image. The image processing device 100 extracts RAW data including a parallax image and displays a thumbnail image list on a screen of the display unit 106. If the user selects a desired thumbnail image, a parallax image corresponding to the selected thumbnail image is displayed on the screen and a mode transitions to a blur shift edit mode.

Figure 8:
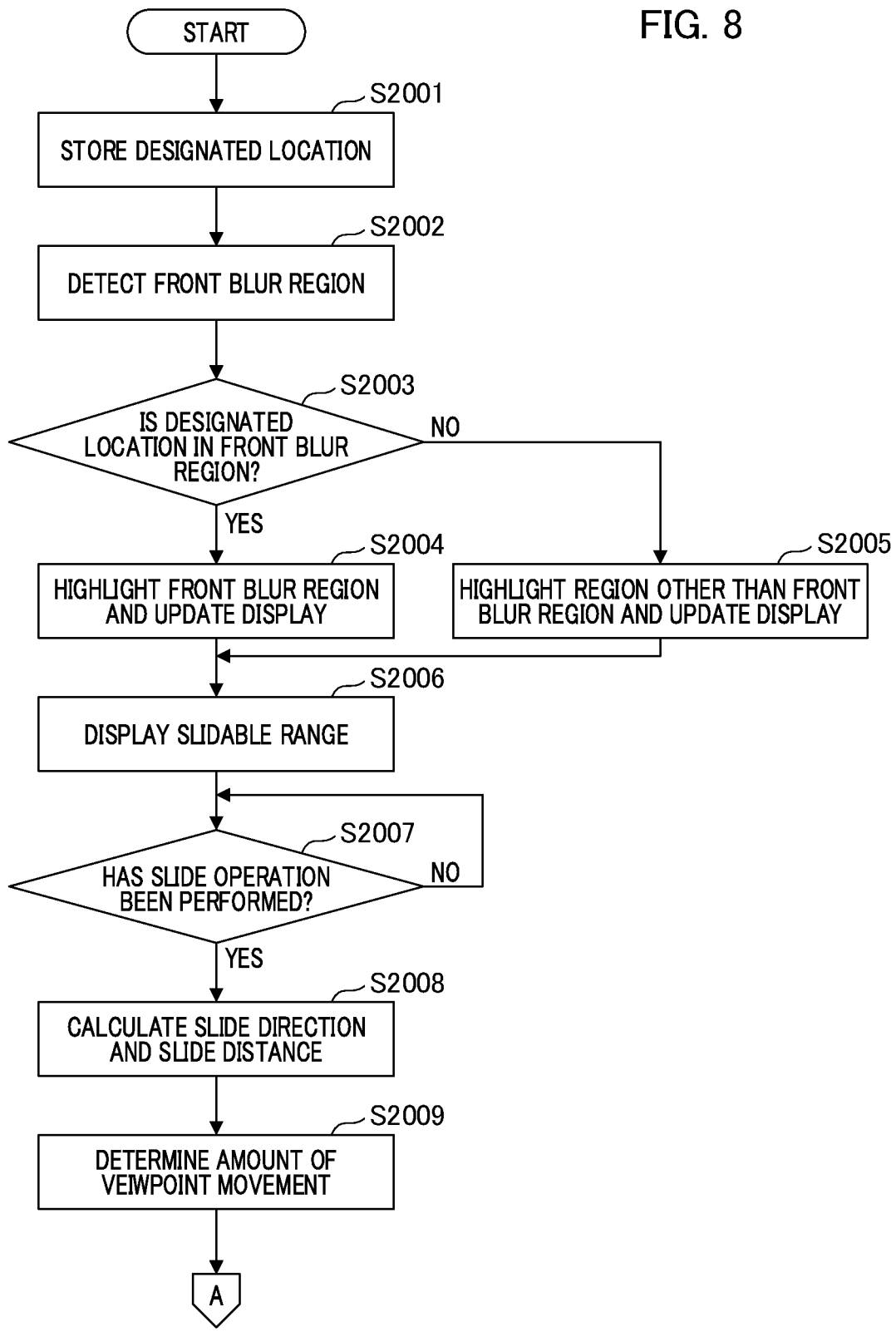
FIG. 8 is a flowchart for explaining control in a first embodiment.

Blur shift processing in the image editing function will be described with reference to FIG. 8 to FIG. 10D. FIGS. 8 and 9 are flowcharts for explaining viewpoint change in a blur shift edit function and the following processing is realized using the CPU of the system control unit 103 executing a program. FIGS. 10A to 10D are diagrams illustrating an example of display of the display unit 106. FIG. 10A is a diagram showing a state in which editing is not performed and illustrates a state in which front blurring has occurred in a region 1002 indicated by a dotted frame in front of a subject region 1001 corresponding to an imaging target.

First, the user designates a target to be moved from images displayed on the display unit 106 using the operation unit 107. The system control unit 103 stores coordinate data on the screen designated through the user operation in the memory 104 (S2001). The image processing unit 105 detects the front blur region in an image being edited (S2002). The front blur region is detected by detecting a blur region in the image and extracting only a blur closer to a front side (the imaging device side) than the image formation position from the region. Details of a blur region detection process will be described later with reference to FIG. 12. After a blur region has been detected, the image processing unit 105 sets a region determined to be a blur region in front of the image formation position as the front blur region using distance information obtained by the distance information acquisition unit 108.

The system control unit 103 determines whether a position designated by the user is in the front blur region from coordinate data stored in the memory 104 in S2001 and the front blur region detected in S2002 (S2003). If it is determined as the result of determination that the position designated by the user is in the front blur region, the process proceeds to the process of S2004. In addition, if it is determined that the position designated by the user is not in the front blur region, the process proceeds to the process of S2005.

In S2004, the system control unit 103 performs a process of highlighting the front blur region detected in S2002 and updating the display content of the display unit 106. Furthermore, in S2005, the system control unit 103 performs a process of highlighting a region other than the front blur region detected in S2002 and updating the display content of the display unit 106. After S2004 or S2005, the process proceeds to the process of S2006. In S2006, in order to clearly indicate an operable range for the user after the selection, a range in which a slide operation is possible centered around a point selected by the user is displayed on the screen of the display unit 106. A specific example will be described with reference to FIG. 10B.

Figure 10B:
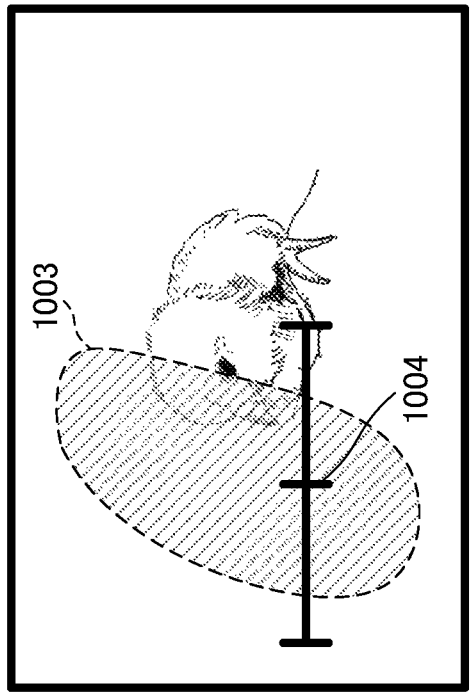
FIGS. 10A to 10D are diagrams for explaining an example of display in the first embodiment.

FIG. 10B is a diagram illustrating a state in which it is determined in the process of S2003 that the position designated by the user is in the front blur region in the blur shift edit function. A region 1003 indicates that the position designated by the user is in the front blur region by emphasizing that the region is the front blur region. A range in which a slide operation is possible 1004 represents a range in which a slide operation of the user is possible in S2006. The range in which a slide operation is possible 1004 has a predetermined width centering on the position designated by the user and FIGS. 10A to 10D illustrate an example of scale display. With regard to the range in which a slide operation is possible 1004 to be displayed, it is not necessary to display a distance in which the front blur region is moved on the screen. The range in which a slide operation is possible 1004 on the screen is displayed so that the user can finely adjust the movement of the front blur region due to the viewpoint change and scale adjustment can be performed through the user operation. Furthermore, not only the slide operation but also an equivalent operation may be performed by a drag operation, a flick operation, or the like.

The above operation is an operation in which the user directly performs an operation by touching a touch panel on a screen section of the display unit 106 with a finger. The above operation is not limited to this and may be a method of displaying a cursor on the screen of the display unit 106 and allowing the user to move the cursor with a button or a pointing device arranged on the image processing device 100 to select a predetermined location. In this case, a range in which an operation is possible may be displayed in another location.

Figure 10D:
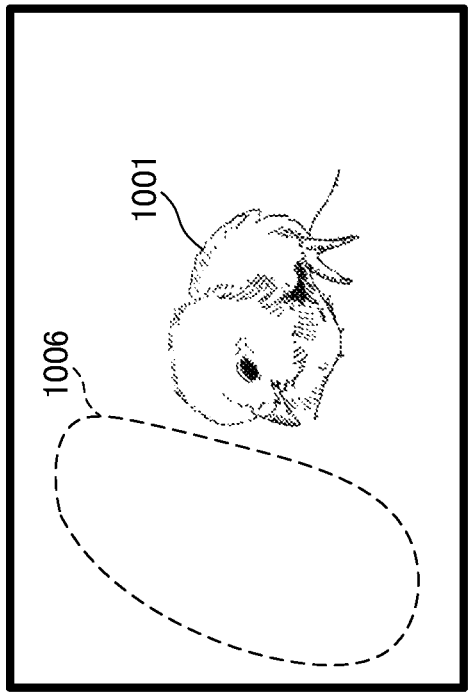
Figure 10A:
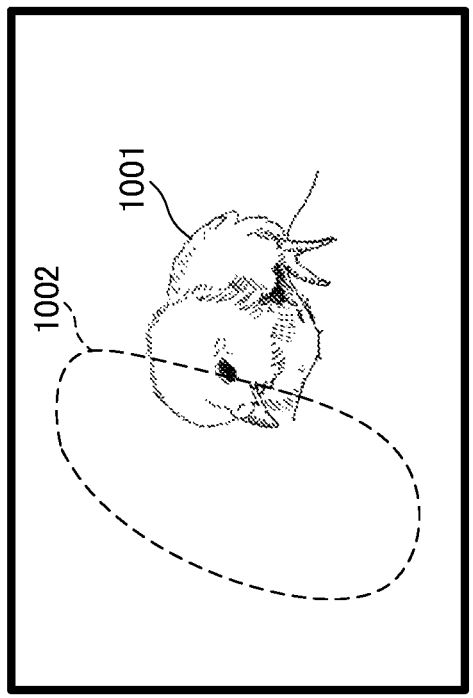
Figure 10C:
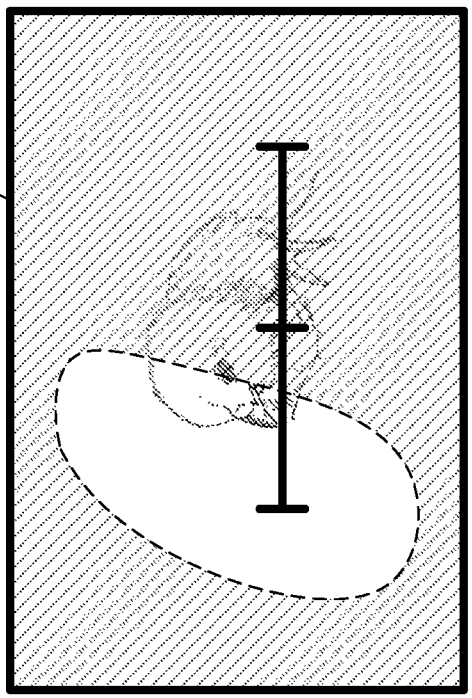

FIG. 10C illustrates an example in a case in which it is determined in S2003 of FIG. 8 that an external region other than the front blur region is designated. A region 1005 is highlighted so that it can be seen that a region outside of the front blur region is selected. The highlighting method illustrated in FIG. 10C is an example. For example, if the user performs a designation above the subject region 1001, the image processing device 100 may perform a process of recognizing a subject region and perform display so that only the subject region 1001 or only an outline region thereof is emphasized.

After S2006 in FIG. 8, the system control unit 103 determines whether a slide operation by the user has been performed (S2007). When a slide operation has been performed within the range indicated by the possible range 1004 from a position designated by the user, the process proceeds to the process of S2008. While a slide operation has not been performed, the determination process of S2007 is repeatedly performed. In S2008, the system control unit 103 calculates a direction in which the user performs the slide operation and a slide distance from coordinate data after the slide operation and coordinate data stored in S2001. Subsequently, the system control unit 103 determines an amount of viewpoint movement from the slide distance calculated in S2008 (S2009). The system control unit 103 determines whether the region detected in S2002 is a front blur region (FIG. 9: S2010). If it is determined that a front blur region has been designated, the process proceeds to the process of S2011. In addition, if it is determined that a region other than a front blur region has been designated, the process proceeds to the process of S2012.

In S2011, the system control unit 103 determines a viewpoint movement direction in a direction opposite to the slide operation direction (for example, a leftward direction in FIG. 10B) calculated in S2008. Furthermore, in S2012, the system control unit 103 determines the viewpoint movement direction in the same direction as the slide operation direction (for example, a rightward direction in FIG. 10C) calculated in S2008. After S2011 or S2012, in S2013, the system control unit 103 determines a viewpoint position on the basis of the determined amount of viewpoint movement and viewpoint movement direction.

The image processing unit 105 combines parallax images in accordance with the viewpoint position determined in S2013, generates each of data of a recording image and a displaying image, and records the data in the memory 104 (S2014). A specific example will be described with reference to FIG. 10D.

FIG. 10D illustrates an example in which a combined image after the viewpoint movement is displayed. A viewpoint movement operation is performed through the user operation and viewpoint changing processing is performed. As a result, the front blur region 1002 which covers the subject region 1001 in FIG. 10A has been moved to a region 1006 at a position in which the region 1006 does not cover the subject region 1001 and an image intended by the user can be obtained.

In S2015 of FIG. 9, the display unit 106 reads the display image data stored in the memory 104 and updates the display content. At this time, GUI display for designating whether to save the result displayed on the screen of the display unit 106 is performed and a process of receiving an instruction from the user is performed.

In S2016, the system control unit 103 determines whether to receive the user operation and save display data. If it is determined that the user has instructed to save the data, the process proceeds to the process of S2017. In S2017, the system control unit 103 and the image processing unit 105 combine saving image data on the basis of the viewpoint position determined in S2013, perform various image processing on the data, record image data in the recording medium 111, and then end the edit mode. If the user does not instruct to save the data in S2016, the edit mode ends without saving the data.

Figure 11:
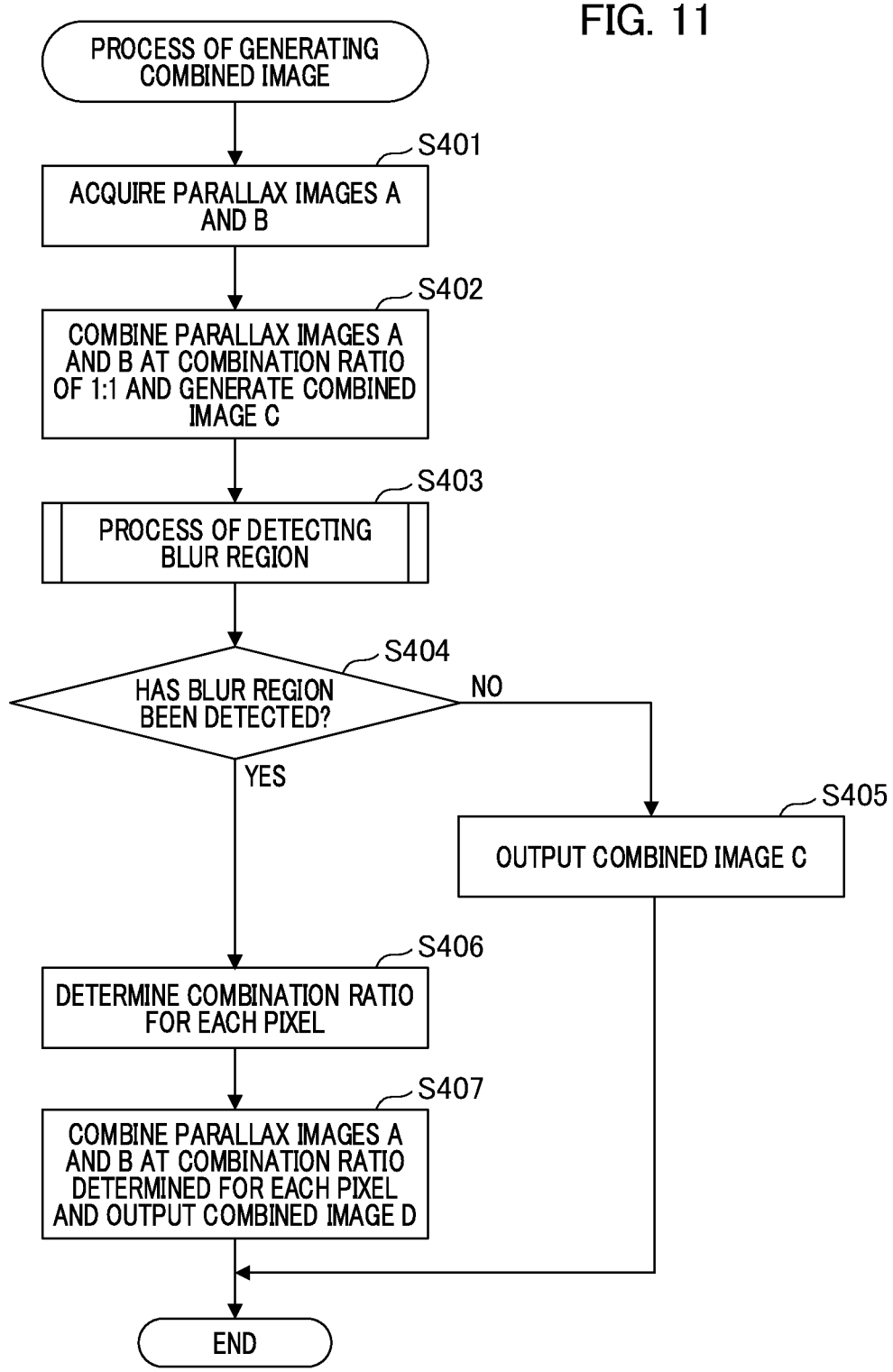
FIG. 11 is a flowchart for describing a process of generating a combined image.

With regard to the processes of S2014 and S2017 of FIG. 9, a process of changing a viewpoint from a parallax image to generate a combined image will be described with reference to FIG. 11. FIG. 11 is a flowchart for describing a process of generating a combined image. Hereinafter, with regard to parallax images A and B which are not combined, an image A is assumed to be a first viewpoint image and an image B is assumed to be a second viewpoint image.

In S401 of FIG. 11, the image processing unit 105 acquires data of the parallax images A and B from the memory 104, the recording medium 111, an external device, or the like and supplies the data to the image combining unit 105b. In S402, the image combining unit 105b combines the data of the parallax images A and B acquired in S401 at a reference combination ratio of 1:1 and generates data of a combined image C. In S403, the blur region detecting unit 105a detects a blur region included in a region of a subject located near an in-focus distance from the parallax images A and B and the combined image C on the basis of distance information associated with the parallax images. This blur region is a region of front blurring caused by a subject located to be closer to a front side (the imaging device side) than a subject at the in-focus distance.

In S404, the image processing unit 105 determines whether a blur region is detected by the blur region detecting unit 105a. If it is determined that a blur region has been detected, the process proceeds to the process of S406. In addition, if it is determined that a blur region has not been detected, the process proceeds to the process of S405. In S405, the image processing unit 105 outputs the data of the combined image C generated in S402 and ends the process of generating a combined image.

In S406, the combination ratio calculating unit 105c determines a combination ratio for each pixel of the parallax images A and B in accordance with a viewpoint movement direction and an amount of movement. In S404, if a blur region is detected, a combination ratio of the parallax images A and B to the blur region is calculated. With regard to a region other than the blur region, the combination ratio of the parallax images A and B for pixels at a predetermined distance or more from the blur region is set to a reference combination ratio "1:1." With regard to pixels at a predetermined distance or less from the blur region, a combination ratio is calculated through linear interpolation in accordance with a combination ratio, a reference combination ratio, a distance, or the like of the blur region. A distance of a target pixel from the blur region can be a shortest distance between the pixel and a pixel forming an outer edge of the blur region. If the combination ratio calculating unit 105c has determined a combination ratio for each pixel, the process proceeds to the process of S407. In S407, the image combining unit 105b combines the parallax images A and B using the combination ratio determined for each pixel by the combination ratio calculating unit 105c and generates and outputs data of a combined image D. The front blurring in which the image quality of an image of the first subject deteriorates due to the combination of the blurred image of the second subject present in front of the first subject at an in-focus position can be minimized by changing the combination ratio of the parallax images A and B and performing correction.

Figure 12:
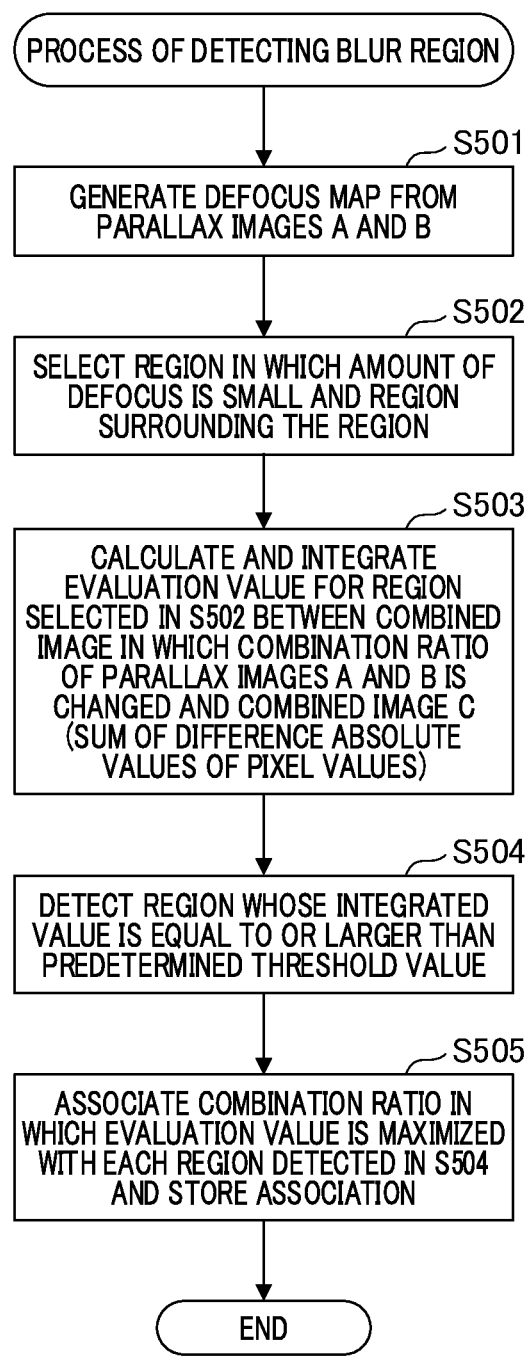
FIG. 12 is a flowchart for explaining a process of detecting a blur region in the first embodiment.

The blur region detection process in S403 will be described with reference to the flowchart of FIG. 12. In S501, the image processing unit 105 generates a defocus map from the data of the parallax images A and B. The defocus map is information representing an amount of defocus for each region of the image or for each pixel. The amount of defocus corresponds to a distance from the imaging device to the subject and corresponds to subject distance information representing depth information of a depth direction of a captured image. A method of generating a defocus map is known. For example, each of the parallax images A and B is divided into a plurality of regions and a process of detecting an amount of relative movement in which an amount of correlation of a pixel value in the corresponding divided region is maximized is performed. The amount of relative movement corresponds to an amount of shift or an amount of image shifting and is detected as a phase difference with respect to a region of interest. The amount of defocus is calculated by multiplying an amount of image shifting by a predetermined conversion coefficient and a defocus map indicating a distribution of the amount of defocus is generated. The conversion coefficient is determined on the basis of an aperture of the imaging optical system, a center-of-gravity interval between sensitivity distributions of the parallax images A and B, or the like. The subject distance information is not limited to a defocus map and may be an image shifting amount map indicating a distribution of an amount of image shifting or a distance map obtained by converting an amount of defocus into distance information of the subject.

In S502, the blur region detecting unit 105a selects a region in which an amount of defocus is equal to or less than a predetermined threshold value and a region surrounding the region from the defocus map generated in S501. The region of the subject at an in-focus distance and the region surrounding the region are detected. For example, a case in which a region in a depth of focus is selected on the basis of the defocus map is assumed. In a case in which one pixel section is constituted to have two photoelectric conversion units, if an aperture value (an F value) of the imaging optical system is denoted by F and a permissible circle of confusion diameter is denoted by $\delta$, a region in which an absolute value of the amount of defocus is $2F\delta$ or less is selected. In a case in which one pixel section is constituted to have N vertical×N horizontal photoelectric conversion units, a region in which the absolute value of the amount of defocus is $NF\delta$ or less is selected.

In S503, the blur region detecting unit 105a detects whether each of the regions selected in S502 includes a blur region. To be specific, the image combining unit 105b sets the combination ratio of the parallax images A and B as $\alpha:(2.0-\alpha)$ and generates a plurality of combined images $K(\alpha)$ by changing a value of $\alpha$ within the range of $0 \leq \alpha \leq 2.0$. The combined images $K(\alpha)$ may be generated only for the region selected in S502, but may be generated for all regions. The blur region detecting unit 105a calculates an evaluation value for each of the combined images $K(\alpha)$ for each small region obtained by further dividing each region selected in S502. The evaluation values are calculated and integrated as a sum of values of absolute differences between pixel values of the combined image $K(\alpha)$ and the combined image C generated in S402. Furthermore, the blur region detecting unit 105a stores an α value in which the evaluation value is maximized in the memory for each of the small areas. The α value is determined on the basis of the processing capability of the image processing unit 105, the image quality required for the combined image, or the like.

In S504, the blur region detecting unit 105a integrates the evaluation value in each of the small regions for a predetermined number of combined images K(α) and detects a small region whose integrated value is equal to or larger than a predetermined threshold value. The small region to be detected is a region in which the evaluation value is significantly changed by changing the combination ratio from the reference combination ratio of 1:1 and corresponds to a region in which blur correction due to the changing of the combination ratio is effective.

In S505, the blur region detecting unit 105a associates the α value in which the evaluation value (the sum of difference absolute values between the pixel values) is maximized with each of the small regions detected in S504 and stores the association in the memory. The combination ratio in which the largest blur correction effect for the small region is obtained is α:(2.0−α).

In this embodiment, the user designates the region of interest, the viewpoint movement direction and the amount of movement are determined in accordance with the designated region, the slide operation direction, and the amount of operation, and the viewpoint changing processing is performed. The user can designate the region to be moved in the image and perform the operation of designating the moving direction and the amount of movement of the designated region. Thus, the viewpoint changing processing can be performed through an intuitive operation of the user. Although the region in which the viewpoint is changed and the combination process is performed is not particularly designated in the above description, the viewpoint changing processing may be applied only to a predetermined region designated by the user. According to this embodiment, when the combined image is generated from the plurality of images with different viewpoints, it is possible to intuitively understand a method in which an output image is changed due to the changing of the viewpoint position. The user can change the viewpoint through an easy-to-understand operation, as compared with a method in which a moving direction of a viewpoint is designated.

Second Embodiment

A second embodiment of the present invention will be described below. This embodiment is different from the first embodiment in that a direction designated by the user is a moving direction of a front blur. In this embodiment, differences from the first embodiment will be mainly described and constituent elements the same as those in the first embodiment will be denoted by the previously used signs and detailed description thereof will be omitted.

Figure 13:
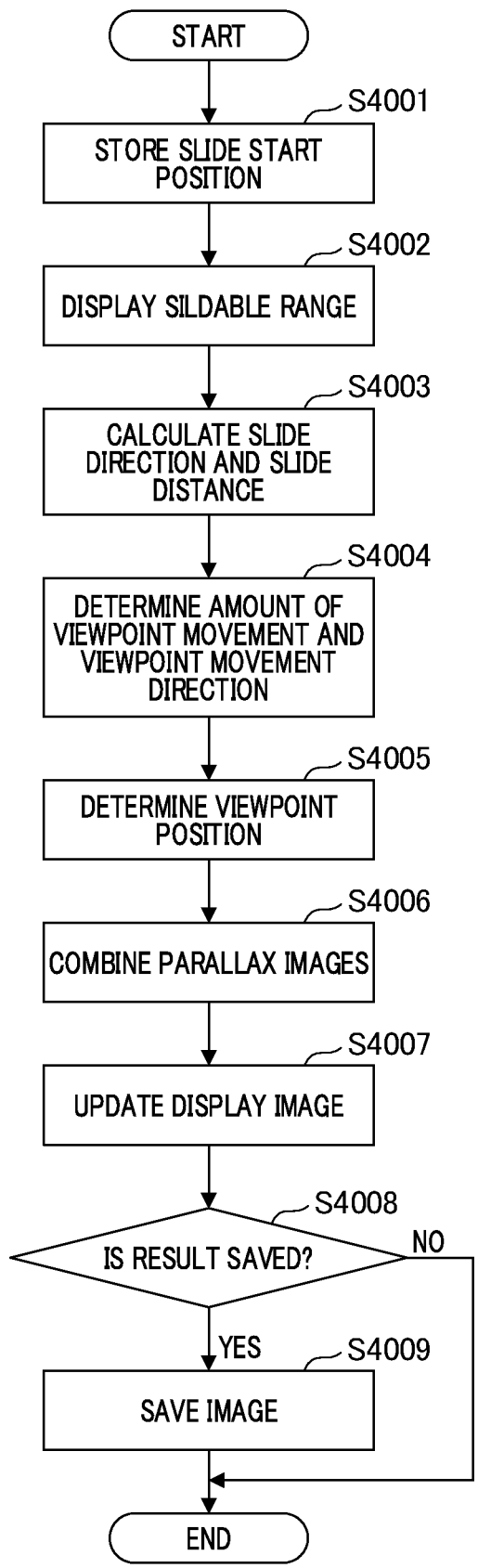
FIG. 13 is a flowchart for explaining control in a second embodiment.

Control performed by a system control unit 103 in this embodiment will be described with reference to the flowchart of FIG. 13. If a mode enters a mode of a blur shift edit function and the user starts a slide operation, the system control unit 103 stores a slide start position in a memory 104 (S4001). The system control unit 103 performs control so that a range in which a slide operation is possible (refer to FIG. 10B) near a slide start position on an image is displayed (S4002).

If the user performs the illustrated slide operation in the range in which a slide operation is possible in S4002, the system control unit 103 calculates a direction in which the user performs the slide operation and a slide distance from the coordinate data stored in S4001 and the coordinated data after the slide operation (S4003). The system control unit 103 determines an amount of viewpoint movement for the slide distance calculated in S4003 and determines a viewpoint movement direction in a direction opposite to the slide operation direction calculated in S4003 so that the front blur region is moved in the slide operation direction (S4004).

The system control unit 103 determines a viewpoint position on the basis of the determined amount of viewpoint movement and viewpoint movement direction (S4005). The image processing unit 105 combines parallax image data, generates recording image data and display image data, and stores them in the memory 104 (S4006). The display unit 106 reads the display image data stored in the memory 104 and updates the display content (S4007). At this time, GUI display for designating whether to save the display result on the screen of the display unit 106 is performed and a process of receiving an instruction from the user is performed.

In S4008, the system control unit 103 determines whether to save the display data. When it is determined that the user has instructed to save the data, the process proceeds to the process of S4009. In S4009, the system control unit 103 and the image processing unit 105 generate saving image data, perform various types of image processing on the image data, record the image data in the recording medium 111, and then end the edit mode. In S4008, if the user does not instruct to save the display data, the edit mode ends without saving the data. Here, if the user performs the slide operation again, the edit mode is started again and the process proceeds to the process of S4001.

Figure 14:
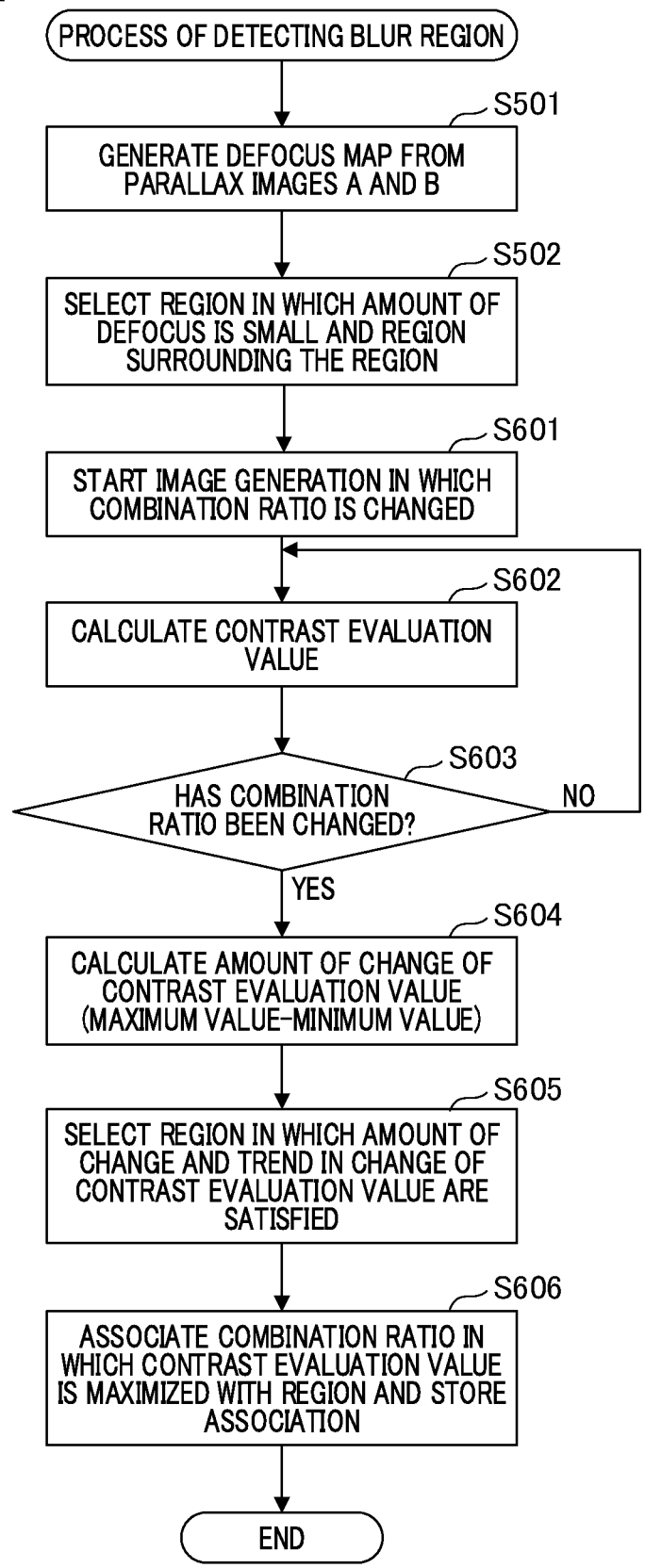
FIG. 14 is a flowchart for explaining a process of detecting a blur region in the second embodiment.

The blur region detection process in this embodiment will be described with reference to the flowchart in FIG. 14. Since the processes of S501 and S502 are the same as that of FIG. 12, description thereof will be omitted, and the processes of S601 to S606 will be described.

After S502, in S601, the blur region detecting unit 105a starts a process of generating a combined images K(α) in which a combination ratio of parallax images A and B is changed. In S602, the blur region detecting unit 105a calculates an evaluation value for each of the regions selected in S502 for each combined images K(α). This evaluation value is a contrast evaluation value indicating a degree of in-focusing. The contrast evaluation value can be calculated using a known method. For example, the blur region detecting unit 105a extracts a component of a predetermined frequency band by applying a band-pass filter to an image region from which the contrast evaluation value is obtained and calculates a difference value between neighboring pixels by applying a differential filter to the extracted component. The blur region detecting unit 105a detects a maximum value of the calculated difference values for lines of an image region to be processed and sets the integrated value as the contrast evaluation value of the image region.

In S603, the blur region detecting unit 105a determines whether the contrast evaluation value of the image region to be processed has been calculated for all of the combined images K(α). If it is determined that all contrast evaluation values have been calculated, the process proceeds to the process of S604. In addition, if it is determined that the calculation has not been completed, the process returns to the process of S602 and continues.

In S604, the blur region detecting unit 105a calculates a difference between a maximum value and a minimum value as an amount of change of the contrast evaluation value calculated for each image region. In S605, the blur region detecting unit 105a selects an image region in which an amount of change and a trend in change of the contrast evaluation value satisfy the following conditions (1) and (2):

(1) the fact that the amount of change of the contrast evaluation value is equal to or larger than a threshold value; and (2) the fact that the contrast evaluation value of the combined images K(α) in which a combination ratio of one viewpoint image (for example, A) gradually increases and a combination ratio of the other viewpoint image (for example, B) gradually decrease monotonically increases or decreases.

With regard to the condition (1), a region in which the contrast evaluation value has a certain difference or more due to the change of the combination ratio is a region in which the degree of in-focusing is changed due to the change of the combination ratio. That is to say, this region is a region in which blur correction is effective. Furthermore, with regard to the condition (2), a contrast evaluation value of a region in which a blur due to image combination does not occur is constant regardless of the combination ratio of the parallax image B. On the other hand, a contrast evaluation value of a region in which a blur due to image combination occurs monotonically decreases, for example, in accordance with a monotonous increase at the combination ratio of the parallax image B.

Although a blur region to be corrected can be detected with a certain degree of accuracy by only imposing the condition (1) of the two conditions, it is possible to accurately detect a region in which a blur occurs due to combination by further imposing the condition (2). The threshold value used for the determination of the condition (1) is a preset fixed value or variable value. In the case of the variable value, the threshold value is changed in accordance with a combination of the photographing sensitivity, the subject brightness, and the like.

In S606, the blur region detecting unit 105a associates the combination ratio of the combined image K(α) in which the contrast evaluation value is maximized with each image region to be processed and stores the association in the memory 104. This combination ratio indicates the combination ratio in which the largest blur correction effect is obtained in each image region.

According to this embodiment, since the user can operate by focusing only on the moving direction of the front blur, the viewpoint changing processing can be performed by a more intuitive operation.

Although an example in which parallax image data is obtained using the imaging element having the photoelectric conversion unit which is pupil-divided in the leftward/rightward direction has been described in the embodiment, the present invention is not limited thereto. For example, a multi-lens camera capable of acquiring parallax images in leftward/rightward and upward/downward directions may be used. In this case, the slide operation performed by the user can be designated in a two-dimensional direction (upward/downward and leftward/rightward directions) in the image. Similarly, the moving direction of the viewpoint can also be determined in a two-dimensional direction.

According to the image processing device of the present invention, it is possible to provide an image processing device which can change a viewpoint by an easy-to-understand operation at the time of generating an image from a plurality of images with different viewpoints.

Other Embodiments

Embodiment(s) of the present invention can also be realized by a computer of a system or apparatus that reads out and executes computer executable instructions (e.g., one or more programs) recorded on a storage medium (which may also be referred to more fully as 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. An image processing device which generates image data on the basis of data of a plurality of viewpoint images with different viewpoints, comprising:
an acquisition unit configured to acquire data of the plurality of viewpoint images;
a designating unit configured to designate a position on an image displayed using a display unit based on a user's touch operation;
at least one processor and memory which is coupled to the at least one processor and stores instructions which cause the at least one processor to perform operations of following units of the image processing device:
a detecting unit configured to detect a moving direction and an amount of movement of the position designated by the designating unit;
a distance information acquisition unit configured to acquire distance information associated with the viewpoint image;
a blur region detecting unit configured to detect a blur region in which a blur has occurred in a second subject located in front of a focused first object among a plurality of subjects using the distance information and the data of the plurality of viewpoint images; and
an image combining unit configured to combine the plurality of viewpoint images in accordance with the amount of movement,
wherein, if a position in the blur region is designated by the designating unit, the image combining unit combines the plurality of viewpoint images by moving the viewpoint in the direction opposite to the moving direction detected by the detecting unit, and if a position in a region outside of the blur region is designated by the designating unit, the image combining unit combines the plurality of viewpoint images by moving the viewpoint in the same direction as the moving direction detected by the detecting unit.

2. The image processing device according to claim 1, wherein the display unit highlights a region including the position designated by the designating unit.

3. The image processing device according to claim 1, wherein the instructions further cause the at least one processor to perform operations of a control unit which performs control so that a region of a slide operation having the position designated by the designating unit as a center is displayed on the display unit.

4. The image processing device according to claim 1, wherein the distance information is information representing a distribution of an amount of image shifting or an amount of defocus associated with the plurality of viewpoint images.

5. The image processing device according to claim 1, wherein the acquisition unit acquires data of the plurality of viewpoint images generated from a pixel signal obtained by photoelectrically converting light which has passed through different pupil partial regions of the imaging optical system through a plurality of photoelectric conversion units.

6. An imaging device, comprising:
an imaging element;
an image processing device which generates image data on the basis of data of a plurality of viewpoint images with different viewpoints and the imaging element which captures an image of a subject, the image processing device comprising:
an acquisition unit configured to acquire data of the plurality of viewpoint images;
a designating unit configured to designate a position on an image displayed using a display unit based on a user's touch operation;
at least one processor and memory which is coupled to the at least one processor and stores instructions which cause the at least one processor to perform operations of following units of the image processing device:
a detecting unit configured to detect a moving direction and an amount of movement of the position designated through the designating unit;
a distance information acquisition unit configured to acquire distance information associated with the viewpoint image;
a blur region detecting unit configured to detect a blur region in which a blur has occurred in a second subject located in front of a focused first object among a plurality of subjects using the distance information and the data of the plurality of viewpoint images; and
an image combining unit configured to combine the plurality of viewpoint images in accordance with the amount of movement,
wherein, if a position in the blur region is designated by the designating unit, the image combining unit combines the plurality of viewpoint images by moving the viewpoint in the direction opposite to the moving direction detected by the detecting unit, and if a position in a region outside of the blur region is designated by the designating unit, the image combining unit combines the plurality of viewpoint images by moving the viewpoint in the same direction as the moving direction detected by the detecting unit.

7. The imaging device according to claim 6, wherein the imaging element has a plurality of microlenses and a plurality of photoelectric conversion units and each of the microlenses corresponds to the plurality of photoelectric conversion units, and
data of the plurality of viewpoint images is generated from outputs of the plurality of photoelectric conversion units corresponding to each of the microlenses.

8. An image processing method which is performed using an image processing device configured to generate image data on the basis of data of a plurality of viewpoint images with different viewpoints, the method comprising:
acquiring data of the plurality of viewpoint images;
designating a position by a designating unit in an image displayed on a display unit based on a user's touch operation;
detecting, by a detecting unit, a moving direction and an amount of movement of the position designated by the designating unit;
acquiring distance information associated with the viewpoint image;
detecting a blur region in which a blur has occurred in a second subject located in front of a focused first object among a plurality of subjects using the distance information and the data of the plurality of viewpoint images; and
combining the plurality of viewpoint images in accordance with the amount of movement,
wherein, if a position in the blur region is designated by the designating, the combining combines the plurality of viewpoint images by moving the viewpoint in the direction opposite to the moving direction detected by the detecting, and if a position in a region outside of the blur region is designated by the designating, the combining combines the plurality of viewpoint images by moving the viewpoint in the same direction as the moving direction detected by the detecting.

9. A non-transitory recording medium storing a control program of a zoom control device causing a computer to perform each step of a control method of the zoom control device, the method comprising:
acquiring data of the plurality of viewpoint images;
designating a position by a designating unit in an image displayed on a display unit based on a user's touch operation;
detecting, by a detecting unit, a moving direction and an amount of movement of the position designated by the designating unit;
acquiring distance information associated with the viewpoint image;
detecting a blur region in which a blur has occurred in a second subject located in front of a focused first object among a plurality of subjects using the distance information and the data of the plurality of viewpoint images; and
combining the plurality of viewpoint images in accordance with the amount of movement,
wherein, if a position in the blur region is designated by the designating, the combining combines the plurality of viewpoint images by moving the viewpoint in the direction opposite to the moving direction detected by the detecting, and if a position in a region outside of the blur region is designated by the designating, the combining combines the plurality of viewpoint images by moving the viewpoint in the same direction as the moving direction detected by the detecting.

* * * * *